United States Patent
Lee et al.

(10) Patent No.: US 8,400,334 B2
(45) Date of Patent: Mar. 19, 2013

(54) ASYMMETRIC DICTIONARY-BASED COMPRESSION/DECOMPRESSION USEFUL FOR BROADCAST OR MULTICAST UNIDIRECTIONAL COMMUNICATION CHANNELS

(75) Inventors: Chik Chung Lee, Hong Kong (CN); Wai Ho Wan, Hong Kong (CN)

(73) Assignee: Thomson Reuters Global Resources (TRGR), Baar (CH)

( * ) Notice: Subject to any disclaimer, the term of this patent is extended or adjusted under 35 U.S.C. 154(b) by 611 days.

(21) Appl. No.: 12/655,529

(22) Filed: Dec. 31, 2009

(65) Prior Publication Data

US 2011/0158307 A1  Jun. 30, 2011

(51) Int. Cl.
*H03M 7/38* (2006.01)
(52) U.S. Cl. ............... 341/51; 375/240.26; 375/240.03; 370/477; 370/521; 714/15; 714/E11.167; 714/E11.177; 382/244; 382/251; 715/234; 707/667; 707/741; 707/792
(58) Field of Classification Search .................. 375/240, 375/E7.209, E7.226, E7.232, E7.252, 240.03, 375/240.26; 713/189; 370/477, 521; 715/322, 715/234; 382/244, 251; 714/15, E11.167, 714/E11.177, E11.207; 725/240; 707/667, 707/741, 792, E17.045, E17.049, E17.055
See application file for complete search history.

(56) References Cited

U.S. PATENT DOCUMENTS

| | | | | | |
|---|---|---|---|---|---|
| 5,140,321 | A  * | 8/1992 | Jung | ............................... | 341/55 |
| 5,281,967 | A  * | 1/1994 | Jung | ............................... | 341/55 |
| 5,999,949 | A  * | 12/1999 | Crandall | ....................... | 715/234 |
| 6,664,903 | B2 * | 12/2003 | Kugai | ............................... | 341/51 |
| 7,580,429 | B1 * | 8/2009 | Wallach | ......................... | 370/521 |
| 7,742,521 | B2 * | 6/2010 | Vitali et al. | .............. | 375/240.03 |
| 8,023,563 | B2 * | 9/2011 | Vella et al. | ............... | 375/240.22 |
| 2011/0296200 | A1* | 12/2011 | Sibert | ............................ | 713/189 |

* cited by examiner

*Primary Examiner* — Lam T Mai
(74) *Attorney, Agent, or Firm* — Oblon, Spivak, McClelland, Maier & Neustadt, L.L.P.

(57) ABSTRACT

An asymmetric approach for compressing digital data, or digitized analog data, uses dictionary-based compression for a transmitter and receiver communicating over a lossy unidirectional communication channel. The transmitter is responsible for generating active dictionaries, selecting appropriate dictionaries for compressing data, retiring old dictionaries, and sending new dictionaries to the receiver. The receiver passively stores the dictionaries from the transmitter and uses the right stored dictionary to decompress data received from the transmitter, as indicated by instructions in the compressed data set.

26 Claims, 2 Drawing Sheets

ASYMMETRIC DICTIONARY-BASED COMPRESSION/DECOMPRESSION USEFUL FOR BROADCAST OR MULTICAST UNIDIRECTIONAL COMMUNICATION CHANNELS

TECHNICAL FIELD

This disclosure relates to data compression and decompression. More particularly, this disclosure relates to dictionary based compression of digital data or digitized analog data.

BACKGROUND

The volume of data required for running a business or an organization grows quickly and continuously. It stresses the technical infrastructure and worsens financial burdens, especially when data streams have to be sent from one source to many destinations, across local area networks (LAN's) and/or wide area networks (WAN's). Sending data streams using broadcast or multicast data delivery techniques can reduce the loading on data sources and the networks, but the use of data compression is still necessary to maximize the use of network capacity. Compression using dynamically generated dictionaries can improve data compression ratios of data with complex data types, frequent data changes or/and data values without obvious boundaries. Most dictionary-based compression schemes require lossless communication paths because both the transmitter and the receiver have to derive dictionaries on-the-fly from the input data. This requires precise synchronization between the dictionary generation in the transmitter and the dictionary generation in the receiver. However, unrecoverable data loss in the network will break the synchronization of dictionary generation between the transmitter and the receiver. The communication will then break down until the compression is reset. In one-to-many broadcast or multicast data streaming, data loss in one destination will impact all destinations. Moreover, the reset is either technically infeasible, functionally complicated, or bandwidth expensive.

There are many well-developed high performance compression dictionary-based algorithms which are designed for session-based or reliable communication channels, e.g. those algorithms used by winzip or pkzip. A dynamic dictionary will be created by the compressor and de-compressor simultaneously to cope with the data pattern changes. Both the compressor and de-compressor have to use the same dictionary harvesting algorithm which will determine the compression efficiency.

In one-way satellite or unreliable delivery channels without feedback paths, loss of one single data packet will cause the building of a dictionary in the de-compressor to be out-of-sync with building of dictionaries in the compressor. The communications between the compressor and the decompressor will break down as a result.

SUMMARY

The problems associated with synchronous dictionary based compression caused by data loss are solved by a novel compression scheme involving asymmetric generation, selection and transmission of data compression dictionaries capable of achieving high data compression ratios.

In specific examples of the invention, dynamic dictionary-based algorithms are used in one-to-many communications over lossy broadcast/multicast channels without feedback paths between the transmitter and the receivers. Compression efficiency is increased and, at the same time, the impact of data packet loss is reduced.

This invention does not need to use of any particular processes of harvesting repetitive data patterns to be used in data compression dictionaries. The invention is applicable to a wide spectrum of data, e.g. quote and trade, news, historical data. The data pattern varies between different data types, between different markets, within a trading day and over months or years. The variation is so significant that dictionaries have to be generated regularly to address data pattern changes. The use of multiple dynamic dictionaries can compress data streams with multiple data types. The passive nature of de-compressor allows improvements in dictionary harvesting algorithms and dictionary selection algorithms to be accomplished in the transmitter without having to upgrade all de-compressors in the receivers (which can number in the thousands spreading across cities and countries). Retransmission of dictionaries addresses the lossy nature of the communication channel and allows communications to resume after dictionary loss.

In one embodiment of the invention, a method of compressing digital data uses data compression dictionaries to reduce the number of bits transmitted from a transmitter to a receiver. The method begins by receiving a first set of digital data in a transmitter and compressing the first set of digital data in the transmitter with a default compression dictionary to create a first set of compressed digital data. The transmitter then sends the first set of compressed digital data to a receiver. The transmitter then applies a dictionary harvesting algorithm to the first set of digital data to identify a first compression dictionary based upon one or more repeating patterns of data in the first data set. The transmitter sends the first dictionary to the receiver. Next, the transmitter receives a second set of digital data, which is compressed using the first compression dictionary to generate a second set of compressed digital data, and then sends the second set of compressed digital data to the receiver. The transmitter applies the dictionary harvesting algorithm to the second set of digital data to generate a second compression dictionary and sends the second dictionary to the receiver.

In other alternative embodiments of the invention, a dictionary that is harvested from the first data set is used to compress the first data set and another dictionary is harvested from the second data set and is used to compress the second data set. The first and second data sets and the two dictionaries are transmitted by the transmitter and sent to one or more receivers.

Another embodiment of the invention involves a method of digital data compression involving dictionary harvesting and selection. This illustrative method involves periodically harvesting a data compression dictionary, by applying a dictionary harvesting algorithm to different sets of input digital data. One or more data compression dictionaries are designated as available for compression and each dictionary is associated with a unique identifier. A dictionary selection algorithm is used to pick an available data compression dictionary to compress a data set. The data compression dictionary selected by the dictionary selection algorithm is used to compress a set of digital data, and an identifier of the selected data compression dictionary used to compress the set of digital data is added to the set of digital data.

In another example of the invention, a method of performing data compression dictionary lifecycle management in a transmitter comprises the steps of sending a dictionary from the transmitter to a receiver before the dictionary is used for compression in the transmitter, periodically sending one or more dictionaries from the transmitter to the receiver to recover from dictionary loss in a unidirectional lossy communication channel, and indicating to a receiver the retirement of a dictionary by the transmitter. In some embodiments, the frequency of the repeating transmission of dictionaries is based on the characteristics of the transmission medium, for example, the repeating transmission of dictionaries is based on line quality.

DETAILED DESCRIPTION

Dictionaries are mappings of "data patterns" containing relatively large numbers of bits to "compression keys" containing relatively small numbers of bits. These mappings are used by compression algorithms to reduce the number of bits needed to represent given amounts of intelligence that is to be communicated between a transmitter and a receiver. A frequently appearing "data pattern" in uncompressed data having a relatively large number of bits can be represented in a data stream between a transmitter and receiver by a "key" having a smaller number of bits than the "data pattern." The use of small keys instead of large actual data patterns will reduce the volume of transmitted data and thus will achieve compression.

The dictionary is a common piece of data residing in both the transmitter and the receiver. The dictionary is generated dynamically by the transmitter and sent one or more times to the receiver. The compressor in the transmitter and decompressor in the receiver have to use the same dictionary to compress and decompress a transmitted data set for an accurate recreation of the data by the receiver.

Dictionaries are generated by the applying a dictionary harvesting algorithm to uncompressed input data. The dictionary harvesting algorithm identifies repeating data patterns in the input data and puts them into the dictionary. The dictionary associates each repeating pattern in the input data entered into the dictionary with a key composed of fewer numbers of bits than are contained in the data patterns. Different data types or the same data types from different data origins can have different characteristics. They thus might require different algorithms for efficient compression. Multiple dictionary harvesting algorithms can be used at the same time and multiple dictionaries may be made available for use by a compression circuit in the transmitter and a decompression circuit in the receiver.

Figure 1:
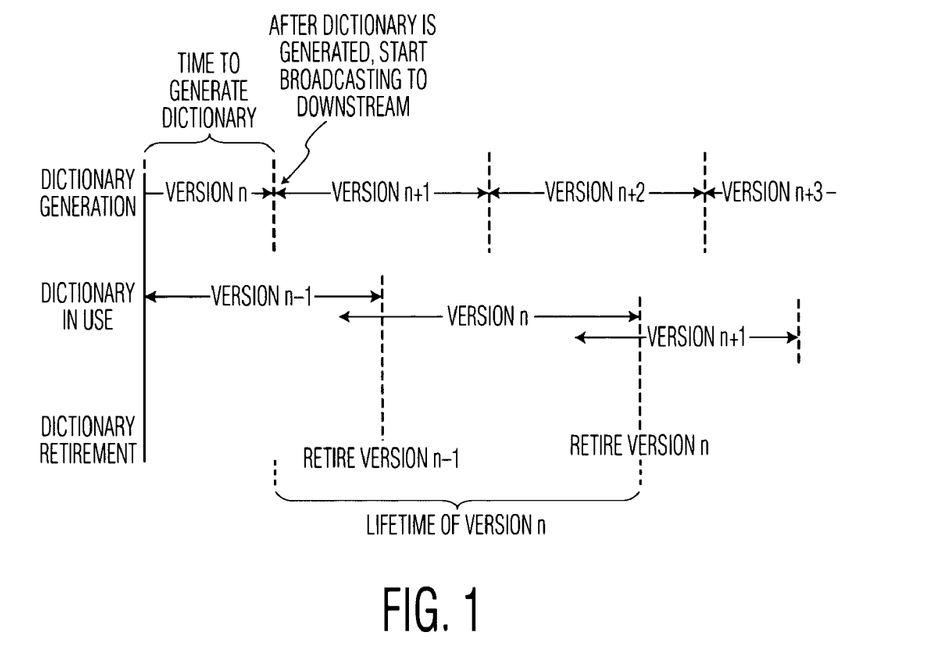
FIG. 1 illustrates the lifecycle of dictionaries in accordance with one example of the invention.

To achieve good compression ratios for changing data, repeating patterns may be constantly harvested from time to time and new dictionaries may be generated continuously. A dictionary can become outdated over time, no longer representing typical data patterns in the input data, and thus cannot achieve its goal of improving compression ratios. Therefore, each dictionary will go through a lifecycle from "Created" to "Active" and then finally "Retired" as shown in FIG. 1. To maintain the best compression ratios for changing data, there also can be multiple active dictionaries available for compression. Accordingly, there is a dictionary selection algorithm to pick the most efficient dictionary for a data set in terms of compression ratio. In other words, the dictionary selection algorithm determines which dictionary will be used for compression for the data set and when a dictionary should be retired.

The dictionary harvesting algorithm and the dictionary selection algorithm are executed inside the transmitter. The transmitter generates dictionaries, sends the dictionaries to the receiver, and informs the receiver about changes of lifecycle state of each dictionary. The transmitter selects a dictionary to compress a data set, compresses the data set, and embeds an identifier of the dictionary into the compressed data. The receiver simply decompresses data according to all information provided by the transmitter. The overall logical data flow and processing is shown in FIG. 2.

Figure 2:
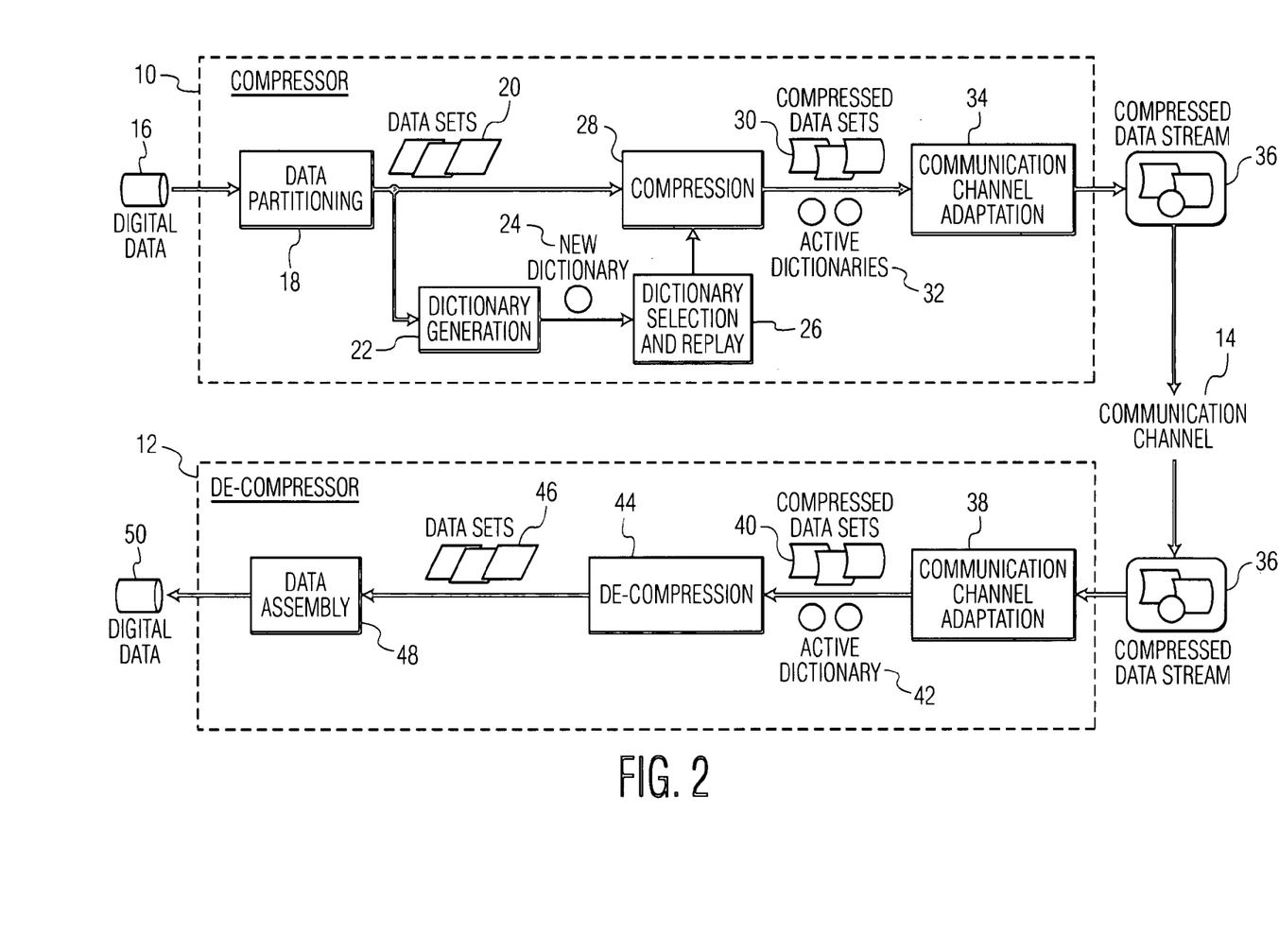
FIG. 2 is a block diagram of an illustrative transmitter communicating with an illustrative receiver depicting overall logical data flow and processing in accordance with one embodiment of the invention.

FIG. 2 shows an example of electronic circuitry useful in implementing one example of the invention. The electronic circuitry of FIG. 2 may be implemented in any manner, for example, by software or firmware in a programmed digital computer or other digital signal processor. Hardware implementations also are possible.

FIG. 2 illustrates a transmitter 10 communicating with a receiver 12 over a lossy communication channel 14. Digital data, which may be news, trade information, financial information, historical data, trade data, quotes, or any other kind of data, is received at an input 16 of the transmitter 10. A data partitioning block 18 in the transmitter 10 divides the input data into smaller data sets 20. The composition of each of the data sets 20 is examined in a dictionary generation circuit 22 which generates a series of dictionaries 24 based on the composition of each data set 20. The dictionary generation circuit may harvest any number of data compression dictionaries from any part of a digital data stream input to the transmitter 10. New dictionaries 24 from the dictionary generation circuit 22 are sent to a dictionary selection and replay circuit 26 which selects a suitable dictionary for use by a compression circuit 28 to apply to each data set 20 to reduce the number of bits to be transmitted to the receiver 12. The compression circuit 28 may apply any suitable data compression dictionary from the dictionary generation circuit 22 to any appropriate part of the digital data stream input to the transmitter 10 to provide one or more compressed data sets. The compression circuit 28 sends compressed data sets 30 and active dictionaries 32 to a communication channel adaptation circuit 34 which interfaces the transmitter 10 to the communication channel 14.

The channel adaptation circuit 34 converts the compressed data to a format suitable to transmission over the communication channel 14. For example, if the communication channel is a satellite channel, the data will be converted by the adaptation circuit 34 into a satellite protocol. If the channel 14 is an IP network, the data will be converted to IP packets by the adaptation circuit 34. The details of such adaptation circuits are well known in the art and are thus not described herein.

At the other end of the communication channel 14, the compressed data stream 36 is introduced into a communication channel adaptation circuit 38 at the input to the receiver 12. The adaptation circuit 38 is well known and converts data received in accordance with the protocol used in the communication channel 14 to a format used in the receiver 12. Compressed data sets 40 and data dictionaries 42, which are copies of the compressed data sets 30 and the active dictionaries 32 produced by the transmitter 10, are output from the adaptation circuit 38 to a decompression circuit 44 in the receiver 12, where the appropriate dictionary 42 is applied to each compressed data set 40 to decompress a respective compressed data set 40, as indicated by the dictionary identifier accompanying the data set 40. Decompressed data sets 46 at the output of the decompression circuit 44 are assembled by a data assembly circuit 48 into a copy of the original data stream that was input to the transmitter 10. The assembled data stream is sent from the receiver 12 at a receiver output 50.

To maintain a suitable compression ratio in a lossy communication channel, the transmitter 10 may have to send a dictionary to the receiver 12 one or more times before the transmitter uses a dictionary for compressing a data set to insure that the receiver has an accurate copy of the dictionary to use to decompress the data from the transmitter. Dictionaries may have a finite lifetime, which may be an amount of time a dictionary is useful in creating a suitable compression ratio in the transmission system. During the lifetime of a dictionary, the transmitter may transmit the dictionary regularly to ensure all receivers accurately receive the dictionary.

Usually, a dictionary will be used for compressing multiple data sets. The size of a dictionary, the frequency of generating new dictionaries, and the number of active dictionaries determines the overhead of using dictionary based compression. The overhead has to be justified against the gain in compression ratio and the probability of dictionary loss over the communication channel.

The overhead of dictionary can be calculated by the following computation:

$$O_{percent} = \frac{O_{rate}}{D_{total}}$$

where
$O_{percent}$=Overhead Percentage
$O_{rate}$=Overhead data bytes per second
$D_{total}$=Total data and dictionary bytes in the compressed data stream per second $$O_{rate} = \frac{D_{size} \times D_{active}}{T_{interval}}$$

where
$O_{rate}$=Overhead data bytes per second
$D_{size}$=Dictionary size in bytes
$D_{active}$=Number of active dictionaries
$T_{interval}$=Time interval of sending a dictionary in seconds Example 1: if
Dictionary size=64 kbytes
Number of active dictionaries=2
Time interval of sending a dictionary=0.5 seconds $$\Rightarrow \text{Dictionary Bandwidth} = \frac{64 \text{ k} \times 2}{0.5} = 256 \text{ kbytes/sec}$$

Total data and dictionary bytes in the compressed data stream per second=1024 kbytes/sec Then, $$\text{Overhead Percentage} = \frac{256 \text{ k}}{1024 \text{ k}} = 25\%$$

In this example, the use of this approach can only be justified if the use of the dictionary can improve the compression ratio by more than 25%.

Example 2: if
Dictionary size=64 kbytes
Number of active dictionaries=2
Time interval of sending a dictionary=0.5 seconds $$\Rightarrow \text{Dictionary Bandwidth} = \frac{64 \text{ k} \times 2}{0.5} = 256 \text{ kbytes/sec}$$

Total data and dictionary bytes in the compressed data stream per second=10240 kbytes/sec Then, $$\text{Overhead Percentage} = \frac{256 \text{ k}}{10240 \text{ k}} = 2.5\%$$

In this example, the use of this approach can be justified if the use of the dictionary can improve the compression ratio by more than 2.5% which is easily achievable.

The time interval of sending a dictionary depends on a number of factors. If the chance of dictionary loss is high, the time interval has to be reduced to recover a lost dictionary. If the data pattern changes frequently, the time interval has to be reduced to maintain good compression ratio. Therefore, $$T_{interval} \propto \frac{1}{L \times F}$$

where
$T_{interval}$=Time interval of sending a dictionary
L=Chance of dictionary loss
F=Frequency/degree of data pattern changes In accordance with some implementations of this invention, all the parameters above are controlled in the transmitter 10. As long as the receiver 12 does not make any assumptions on the values of these parameters, the overhead percentage can be adjusted according to the network design and environment. The transmitter 10 and the receiver 12 have to use the same protocol for sending and receiving compressed data and dictionaries and must use the same method of mapping keys to repeating patterns. However, changes or improvements in dictionary harvesting algorithms or selection algorithms can be done in the transmitter only. These are significant advantages for one-to-many broadcast or multicast communications.

Dictionary Harvesting Algorithm

The objective of dictionary harvesting is to identify repeating patterns of data which may be useful for compression. Many known algorithms can be used in this invention. Two examples are Huffman Coding and the LZ77 algorithm.

When the Huffman Coding compression algorithm is used, the input data will be used to build a statistical model to predict the frequency/probability of the occurrence of input data. The simplest method is to use an order-0 model, which calculates the probability of each input byte independently of any previous bytes. A single table with 256 entries is used to contain the frequency count for each byte that might be encountered in the input data. To achieve better compression ratio, a higher order model can be used but the memory and processing power requirement will be higher.

The LZ77 algorithm can find repeating occurrences of strings. These strings are then put in a hash table to allow fast searching. Basically, the dictionary holds a set of string patterns which appears more than once. The dictionary harvesting algorithm will examine all string patterns and select some to put in the dictionary. It will try to include only those string patterns which should reappear in the future, such that the string matching algorithm can find more repeating patterns and save space. One method of increasing the chance of finding matched strings in the dictionary will be trying to include more data variety, i.e. store different kinds of data inside the dictionary. In other words, the algorithm will not include a string pattern if a similar one is already stored.

The Huffman and LZ77 algorithms are just two examples of procedures that may be used as dictionary harvesting algorithms in this invention. Any other known similar algorithm, such as any other historical or predictive algorithm, as can be used as well.

The transmitter and the receiver have to agree on the format of dictionary. However, the receiver does not need to know the algorithm(s) used by transmitter to derive the repeating patterns. Improvements or changes in the harvesting algorithm can be done in transmitter without affecting receiver.

More information on Huffman or LZ77 algorithms can be found at http://www.zlib.net/feldspar.html.

Dictionary Selection Algorithm

This algorithm selects the best dictionary for compressing a particular set of input data. The dictionary harvesting algorithm may generate multiple dictionaries, each of which may have different characteristics and thus may perform differently on different kinds of data. The simplest way of selecting an appropriate dictionary to compress a given piece of data is to try compressing the data with each of the dictionaries and then determine which dictionary has the highest compression ratio. It might be too slow, however, in certain situations to perform multiple compressions of same set of data. Another method is to try to detect the nature of the data and choose a dictionary generated by the corresponding type of data. For example, dictionaries generated by harvesting news data will generally give better compression ratio for news data.

A number of techniques can be used to determine when to retire a dictionary. The simplest way is to retire the oldest dictionary. Other methods of retiring a dictionary may be based on the historical compression efficiency of each dictionary. The selection of a dictionary for compressing a set of data and the retirement of a dictionary are totally controlled by the transmitter.

Illustrative Operational Examples of the Invention

In one specific example of the invention, a digital data stream is received at the input 16 of the transmitter 10. The digital data stream is broken up into a plurality of data sets 20 by the data partitioning circuit 18. A first dictionary harvesting algorithm is applied by the dictionary generation circuit 22 to a first one of the data sets to generate a first dictionary which is sent to the dictionary selection circuit 26 and the compression circuit 28. To create a dictionary, the generation circuit 22 examines the first set of data to identify repeating patterns of bits. The circuit 22 then associates each identified pattern with a unique key having a number of bits less than the number of bits in each repeating pattern. The key can be substituted for its associated repeating pattern to reduce the number of bits that need to be transmitted. The first dictionary harvesting algorithm is also applied to a second data set 20 by the dictionary generation circuit 22 to identify a second repeating pattern. As in the case of the first data set 20, a second dictionary independent of the first dictionary, based upon the second repeating pattern, is generated by the dictionary generation circuit 22 and sent to the dictionary selection circuit 26 and the compression circuit 28. The compression circuit 28 then compresses the first set of digital data with the first compression dictionary to generate a first set of compressed digital data. The compression circuit 28 also compresses the second set of digital data with the second compression dictionary to generate a second set of compressed digital data. The compression circuit 28 may also compress additional data sets with the same or other compression dictionaries harvested from the input data. Any number of data compression dictionaries may be harvested from any part of a data stream input to the transmitter 10, and any of those dictionaries may be used to compress any suitable part of the input data stream. The compression may be done, for example, by a Huffman encoder. An output set of data from the transmitter 10 may be unicast, multicast, or broadcast to one or more receivers 12, the output set of data comprising the first set of compressed digital data, the first compression dictionary, the second set of compressed data, and the second dictionary. As will be appreciated by those skilled in the art, the transmitter 10 may repeat the process of generating dictionaries from any number of subsequent data sets beyond the two data sets described above, sending those dictionaries to the receiver 12, and using those dictionaries to compress respective other data sets for transmission to the receiver 12. In some cases, it may be possible to use a dictionary to compress not only the data set from which it was derived, but also to compress other data sets. It may also be possible to generate more than one dictionary from a single data set. It may also be possible to generate a library of active dictionaries, stored in the transmitter and sent to the receiver, from which the dictionary selection circuit 26 may select to appropriately compress one or more data sets 20. In each case, an identifier of the dictionary is added to each dictionary. When any particular dictionary is used to compress a data set 20, the identifier of that dictionary is added to the compressed data set so that the receiver 12 can use the right dictionary to decompress the data set. As alluded to above, dictionaries may be selectively retired by the transmitter when they are no longer useful.

In each receiver 12 in accordance with this example of the invention, a compressed data stream 36 composed of the first and second sets of compressed digital data and the first and second dictionaries are received at an input of the receiver 12. The first set of compressed digital data is decompressed with a first decompression dictionary to generate a first set of decompressed digital data, the first decompression dictionary being related to the first compression dictionary from the transmitter 10. The second set of compressed digital data is decompressed with a second decompression dictionary to generate a second set of decompressed digital data, the second decompression dictionary being related to the second compression dictionary. The first set of decompressed digital data and the second set of decompressed digital data are stored for subsequent reassembly into the original digital data stream by the data assembly circuit 48.

The principles of this invention are applicable to transmitting all kinds of data between a transmitter and a receiver, including but not limited to news data, financial data, historical data, quotes, and trade data.

In another illustrative embodiment of the invention, a method of compressing digital data uses default data compression dictionaries and data compression dictionaries derived from the digital data to reduce the number of bits transmitted from a transmitter to a receiver. The method begins by receiving a first set of digital data in the transmitter 10. The compression circuit 28 compresses the first set of digital data in the transmitter 10 with a default compression dictionary, stored in both the transmitter 10 and the receiver 12, to create a first set of compressed digital data. The transmitter 10 then sends the first set of compressed digital data to the receiver 12. The dictionary generation circuit 22 in the transmitter 10 then applies a dictionary harvesting algorithm to the first set of digital data to identify a first compression dictionary based upon one or more repeating patterns of data in the first data set. The transmitter 10 sends the first dictionary to the receiver 12. Next, the transmitter 10 takes a second set of digital data, which is compressed using the first compression dictionary to generate a second set of compressed digital data, and then sends the second set of compressed digital data to the receiver 12. The transmitter 10 applies the dictionary harvesting algorithm to the second set of digital data to generate a second compression dictionary and sends the second dictionary to the receiver 12. The transmitter 10 may also compress additional data sets with the same or other compression dictionaries harvested from the input data. Any number of data compression dictionaries may be harvested from any part of a data stream input to the transmitter 10, and any of those dictionaries may be used to compress any suitable part of the input data stream.

As in the examples described above, the compression procedures used involve substitution of a key stored in a dictionary for a repeating pattern of bits in a set of digital data, the number of bits in the key being less than the number of bits in the repeating pattern. The compressed sets of digital data identify the dictionary that was used to compress the sets of digital data. The default dictionary is an indication of how to compress data or it may be an indication that its associated data is non-compressed data. The sets of digital data are compressed with multiple independent compression algorithms involving multiple independent data compression dictionaries.

The apparatus of FIG. 2 also may perform a method of dictionary harvesting and selection in the course of performing digital data compression. The apparatus of FIG. 2 in this example of the invention is adapted to periodically harvest a data compression dictionary, by applying a dictionary harvesting algorithm, to different sets of input digital data 20. The apparatus of FIG. 2 also is adapted to designate one or more data compression dictionaries as available for compression. Each dictionary is associated with a unique identifier. The dictionary selection circuit 26 in FIG. 2 uses a dictionary selection algorithm to pick an available data compression dictionary to compress a data set. The compression circuit 28 uses a data compression dictionary selected by the dictionary selection algorithm to compress a set of digital data and the compression circuit 28 also adds to the compressed set of digital data 30 an identifier of the selected data compression dictionary used to compress the set of digital data 30. A default dictionary may be used at any time during a communication between the transmitter 10 and the receiver 12. An example of times when a default dictionary may used is when the compressor starts or restarts. The default dictionary may be used to synchronize the transmitter 10 and the receiver 12.

In some examples of the invention, the apparatus of FIG. 2 may be adapted to perform data compression dictionary lifecycle management in the transmitter 10. The apparatus of FIG. 2 sends a dictionary from the transmitter 10 to a receiver 12 before the dictionary is used for compression in the transmitter 10, periodically sends one or more dictionaries from the transmitter to the receiver to recover from dictionary loss in a unidirectional lossy communication channel, and indicates to the receiver 12 the retirement of a dictionary by the transmitter 10. The frequency of the repeating transmission of dictionaries is based on the characteristics of the transmission medium, for example, the repeating transmissions may be based on the line quality.

The apparatus of FIG. 2 also may be adapted to perform passive data decompression in the receiver 12. The receiver 12 continuously receives one or more data decompression dictionaries and a first set of compressed digital data. The receiver 12 decompresses the first set of compressed digital data in the receiver 12 using a dictionary specified by an identifier inserted into the first set of compressed data by the transmitter 12. The receiver 12 also receives a second set of compressed digital data and decompresses the second set of compressed digital data with a dictionary specified by an identifier inserted into the second set of compressed data by the transmitter 12. A default dictionary may be used by the receiver 12 to decompress one or more of the sets of compressed digital data. The receiver 12 receives data decompression dictionaries from the transmitter 12, does not generate dictionaries from any of the compressed data sets, and will follow the instructions from the transmitter 12 as to when dictionaries received from transmitter 10 will be used or retired. In all cases in this example of the invention, the receiver 12 stores, uses, or retires data decompression dictionaries in accordance with instructions received from the transmitter.

One particularly advantageous illustrative use of the invention disclosed herein is in DVB satellite broadcast systems which is a high speed one-way satellite communication system. The invention provides cost effective mechanism to send data to many clients who are less sensitive to data latency, especially those in countries without high quality and cost-effective high speed terrestrial communication lines.

CONCLUSION

A transmission system involving dictionary generation and synchronisation for compressing digital data streams over lossy broadcast/multicast networks without a feedback path from the receiver to the transmitter has been disclosed.

The invention uses data compression dictionaries which are mappings of repeating data patterns in digital data sets to shorter digital representations or codes. A compressor and a de-compressor in a digital transmission system have to use the same dictionary and algorithm on the same pieces of data. In the past, two different types of data compression dictionaries and algorithms were commonly used in data compression under different application domains.

The first type was to use pre-agreed dictionaries residing in both the transmitter and the receiver to achieve optimal compression effectiveness for specific data types that do not vary too much over time. This kind of compression will only be effective if the variation of data is small and predictable, e.g. in audio data.

The second type was to use pre-agreed dictionary generation algorithms residing in both the transmitter and the receiver to generate data compression dictionaries on-the-fly according to changes in characteristics for data with large potential variations. A compressor in the transmitter compressed data using the pre-agreed algorithm(s) to generate data compression dictionaries and then compressed data with those dictionaries accordingly. A de-compressor in the receiver at the same time generated the same dictionaries on-the-fly using the same compression algorithm as compressor and decompressed the data. If there was any data loss, the de-compressor could not generate the correct dictionary and the whole de-compression or communication broke down completely until the de-compression or communication was re-initiated or lost data was retransmitted by the compressor. In a lossy broadcast or multicast environment without a feedback path from the receiver to the transmitter, the compressor was not aware of data loss in the de-compressors. These limitations did not allow the direct use of the prior general dictionary-based compression in such lossy environments.

This invention allows the use of dictionary-based compression in lossy broadcast or multicast channels without feedback paths for any data types, especially those with large data sets and large variations.

The dictionary harvesting logic is the algorithm to find repeating data patterns in a stream of input data. The dictionary generator (running the dictionary harvesting logic), compressor, and de-compressor are decoupled as much as possible. Data blocks are fed into the dictionary generator and compressor. The dictionary generator located in the transmitter will generate dictionaries according to input data patterns. Circuitry in the transmitter selects the appropriate dictionary, compresses a data block with the selected dictionary, sends the compressed data block with a dictionary ID, and sends and resends the dictionaries periodically to the receiver. The de-compressor in the receiver will only passively receive the dictionaries and use the appropriate dictionary to de-compress the compressed data block as instructed by the transmitter. No particular compression algorithm is required. As long as the format of the dictionary is agreed upon by the transmitter and the receiver, any dictionary harvesting algorithm can be used, changed or improved without affecting the de-compressor in the receiver. Any data types may be handled by the invention. Although the invention can be used in a unicast environment, it has particular benefits in a broadcast environment or a multicast environment where there is one transmitter, and perhaps up to hundreds or thousands of receivers.

After data loss, the time to re-synchronizing the communication system depends on the frequency of dictionary replay or resend. The frequency of dictionary update can be adjusted in light of the nature of the data being sent and the frequency of dictionary replay can be adjusted for the probability of data loss.

The design also allows the existence of multiple active dictionaries. If the performance of the transmitter allows, the transmitter can run multiple dictionary harvesting processes to generate multiple versions of dictionaries and then can select the version of dictionary which will provide the most effective compression of a particular data block. It will produce effective and stable compression results even when data patterns change frequently.

Prior dictionary-based compression algorithms were commonly used to compress data over session-based or reliable communication channels. For data with large potential variations, dynamically changing dictionaries were used. Both the compressor and the de-compressor derived the dictionaries from the data according to the same dictionary harvesting algorithm(s) which determined the compression efficiency. In lossy broadcast/multicast channels without feedback paths, however, the loss of one single data packet made the prior building of dictionaries in the de-compressor out-of-sync with the dictionary building in the compressor and communications broke down completely as a result.

This invention aims to provide a dictionary generation and synchronisation mechanism for lossy broadcast/multicast channels without feedback paths with one or more of the following characteristics:

Compression of any digital data, not restricted to specific data types, as either byte-stream or bit-stream, as long as there are repeating patterns of bits or bytes.

The dictionary is a mapping table from repeating data patterns to keys. Compression can be achieved by using keys with less bits/bytes to represent frequently appearing patterns.

The dictionary generator in the transmitter runs one or more dictionary harvesting algorithms which find repeating data patterns in an input data stream.

The dictionary generator in the transmitter will generate, activate, and retire the dictionaries independently of the operation of the receiver. No fixed dictionary has to be pre-agreed between compressor and de-compressor.

Data blocks are fed into the dictionary generator and compressor. The dictionary generator (which is located in the transmitter) will generate dictionaries according to input data patterns. There can be any number of dictionaries active at one time.

The transmitter selects one of dictionaries received from dictionary generator (by a dictionary selection algorithm), compresses a data block with selected dictionary, sends the compressed data block with dictionary ID, and sends and replays the dictionaries periodically to the de-compressor in the receiver.

The receiver will only passively receive the dictionaries and use the dictionary selected by the transmitter to de-compress the compressed data block. The de-compressor in the receiver does not need to know how the dictionary generator generates, activates, and retires the dictionaries and does not need to know how the transmitter selects an appropriate dictionary to compress a data block.

No particular dictionary harvesting algorithm and dictionary selection algorithm is required.

The dictionary generator, compressor and de-compressor are decoupled as much as possible.

Individual implementation of this invention only need to agree the format of the dictionaries, the translation between keys and data patterns, and the protocol of transmitting data and dictionaries from the compressor to the de-compressor. No particular kinds of these agreements are required by this invention.

The dictionary harvesting algorithm can be improved in the transmitter to give better compression without affecting the de-compression operations in the receiver. The algorithm and the frequency of generating new dictionaries will be data specific and application specific, as determined by the transmitter.

The transmitter can also replay the dictionaries to address data or dictionary loss in lossy communication channels. The frequency of dictionary replay can be tuned according to data nature, application domain, and communication noise characteristics.

This invention can be extended to reliable multicast networks when the data producer has to send data to many data consumers.

The invention claimed is:

1. A method of compressing digital data using dictionaries, comprising the steps of:
receiving a first set of digital data in a transmitter;
compressing the first set of digital data in the transmitter with a default compression dictionary to create a first set of compressed digital data;
sending the first set of compressed digital data to a receiver;
applying a dictionary harvesting algorithm in the transmitter to the first set of digital data to identify a first compression dictionary based upon one or more repeating patterns of data in the first data set;
sending the first dictionary to the receiver;
receiving a second set of digital data in the transmitter;
compressing the second set of digital data with the first compression dictionary to generate a second set of compressed digital data;
sending the second set of compressed digital data to the receiver;
applying the dictionary harvesting algorithm to the second set of digital data to generate a second compression dictionary; and
sending the second dictionary to the receiver.

2. The method of claim 1, in which at least one of the compression steps involves substitution of a key stored in a dictionary for a repeating pattern of bits in a set of digital data, the number of bits in the key being less than the number of bits in the repeating pattern.

3. The method of claim 1, in which the compressed sets of digital data identify the dictionary that was used to compress the sets of digital data.

4. The method of claim 1, in which the default dictionary is a dictionary stored in both the transmitter and the receiver.

5. The method of claim 1, in which the default dictionary is an indication of non-compressed data.

6. The method of claim 1, in which sets of digital data are compressed with multiple independent compression algorithms involving multiple independent data compression dictionaries.

7. A method of digital data compression dictionary harvesting and selection in a transmitter, comprising the steps of:
periodically harvesting in the transmitter a data compression dictionary, by applying a dictionary harvesting algorithm to one or more sets of input digital data;
designating in the transmitter one or more data compression dictionaries as available for compression;
associating each dictionary with a unique identifier;
using, in the transmitter, a dictionary selection algorithm to pick an available data compression dictionary to compress a data set;
using a data compression dictionary selected by the dictionary selection algorithm to compress a set of digital data; and
adding, in the transmitter, to the set of digital data an identifier of the selected data compression dictionary used to compress the set of digital data.

8. The method of claim 7, in which a default dictionary may be used at any time during a communication between a transmitter and a receiver.

9. The method of claim 8, in which the default dictionary is used when a compressor starts or restarts.

10. The method of claim 8, in which the default dictionary is used to synchronize the transmitter and a receiver.

11. A method of performing data compression dictionary lifecycle management in a transmitter, comprising the steps of:
sending a dictionary from the transmitter to a receiver before the dictionary is used for compression in the transmitter;
periodically sending one or more dictionaries from the transmitter to the receiver to recover from dictionary loss in a unidirectional lossy communication channel; and
indicating to a receiver a retirement of the dictionary by the transmitter.

12. The method of claim 11, in which a frequency of repeating transmission of dictionaries is based on characteristics of a transmission medium.

13. The method of claim 12, in which the characteristics of the transmission medium includes line quality.

14. A method of passive data decompression in a receiver, comprising the steps of:
receiving one or more data decompression dictionaries continuously in a receiver;
receiving a first set of compressed digital data in the receiver;
decompressing the first set of compressed digital data in the receiver using a dictionary specified by an identifier inserted into the first set of compressed data by a transmitter;
receiving a second set of compressed digital data in the receiver; and
decompressing the second set of compressed digital data with a dictionary specified by an identifier inserted into the second set of compressed data by the transmitter.

15. The method of claim 14, in which the receiver uses a default dictionary to decompress one or more of the sets of compressed digital data.

16. The method of claim 14, in which the receiver does not generate data decompression dictionaries from any of the compressed data sets and will not decide when dictionaries received from compressor will be used or retired.

17. The method of claim 14, in which the receiver stores, uses, or retires data decompression dictionaries in accordance with instructions received from the transmitter.

18. A method of compressing a digital data stream, comprising the steps of:
(a) receiving a first set of digital data in a transmitter;
(b) applying, in the transmitter, a dictionary harvesting algorithm to the first set of digital data to identify a first repeating pattern;
(c) generating in the transmitter a first dictionary based upon the first repeating pattern;
(d) receiving a second set of digital data in the transmitter;
(e) applying, in the transmitter, the dictionary harvesting algorithm to the second set of digital data to identify a second repeating pattern;
(f) generating, in the transmitter, a second dictionary based upon the second repeating pattern;
(g) compressing, in the transmitter, the first set of digital data with a first compression dictionary to generate a first set of compressed digital data;
(h) compressing, in the transmitter, the second set of digital data with a second compression dictionary to generate a second set of compressed digital data; and
(i) transmitting a compressed data stream to one or more receivers, the compressed data stream comprising the first set of compressed digital data, the first compression dictionary, the second set of compressed digital data, and the second dictionary.

19. The method of claim 18, wherein compressing the first set of digital data and compressing the second set of digital data is done with a Huffman encoder.

20. The method of claim 18, wherein the first dictionary and the second dictionary are generated independently by a dictionary generator.

21. The method of claim 18, wherein the first compression dictionary and the second compression dictionary are independent.

22. The method of claim 18, further comprising the steps of
(a) receiving the first and second sets of compressed digital data in a receiver;
(b) decompressing the first set of compressed digital data with a first decompression dictionary to generate a first set of decompressed digital data, the first decompression dictionary being related to the first compression dictionary;
(c) decompressing the second set of compressed digital data with a second decompression dictionary to generate a second set of decompressed digital data, the second decompression dictionary being related to the second compression dictionary; and
(d) storing the first set of decompressed digital data and the second set of decompressed digital data.

23. The method of claim 18, wherein the data stream comprises data selected from the group consisting of trade data, news data, financial data, quotes, and historical data.

24. A transmitter of a compressed data stream over one or more communication channels, comprising:
a dictionary generation circuit responsive to one or more input digital data sets for applying a dictionary harvesting procedure to one or more of the data sets for generating one or more data compression dictionaries from the one or more data sets;
a dictionary selection circuit adapted to select a data compression dictionary from the dictionary generation circuit for compressing one or more of the data sets;
a compression circuit adapted to compress one or more data sets using a compression dictionary selected by the dictionary selection circuit; and
an interface circuit adapted to output a compressed data stream comprising:
(a) one or more compressed data sets each containing an identifier of the dictionary used to compress the data set,
(b) one or more dictionaries used to compress the data sets in the data stream and to be used by one or more receivers to decompress the compressed data sets, and
(c) one or more dictionary identifiers associated with dictionaries in the data stream to be used by one or more receivers to identify the correct dictionary to decompress each of the one or more compressed data sets.

25. A receiver of a compressed data stream comprising data sets compressed by using one or more data compression dictionaries, the receiver adapted to decompress the compressed data sets without generating the data decompression dictionaries, comprising:
an interface circuit for receiving from a transmitter a compressed data stream comprising:
(a) one or more compressed data sets each containing an identifier of a dictionary used to compress the data set,
(b) one or more dictionaries used to compress the data sets in the data stream and to be used by one or more receivers to decompress the compressed data sets, and
(c) one or more dictionary identifiers associated with dictionaries in the data stream to be used by one or more receivers to identify the correct dictionary to decompress each of the one or more compressed data sets; and
a decompression circuit responsive to the identifiers in the one or more data sets and the dictionary identifiers to decompress the compressed data sets using the correct data compression dictionary.

26. A transmission system comprising a transmitter communicating with a receiver over a lossy unidirectional communication channel and involving data compression using data compression dictionaries generated only in the transmitter and not in the receiver, comprising:
a transmitter of a compressed data stream over the lossy unidirectional communication channel, comprising:
a data partition circuit adapted to partition digital input data into a plurality of data sets;
a dictionary generation circuit responsive to the data sets for applying a dictionary harvesting procedure to one or more of the data sets for generating one or more data compression dictionaries from the one or more data sets;
a dictionary selection circuit adapted to select a data compression dictionary from the dictionary generation circuit for compressing one or more of the data sets;
a compression circuit adapted to compress one or more data sets using a compression dictionary selected by the dictionary selection circuit; and
an interface circuit adapted to output a compressed data stream to the communication channel, comprising:
(a) one or more compressed data sets each containing an identifier of the dictionary used to compress the data set,
(b) one or more dictionaries used to compress the data sets in the data stream and to be used by one or more receivers to decompress the compressed data sets, and
(c) one or more dictionary identifiers associated with dictionaries in the data stream to be used by one or more receivers to use the correct dictionary to decompress each of the one or more compressed data sets; and
a receiver of a compressed data stream from the communication channel, comprising data sets compressed by using one or more data compression dictionaries, the receiver adapted to decompress the compressed data sets without generating the data decompression dictionaries, comprising:
an interface circuit for receiving from a transmitter a compressed data stream comprising:
(a) one or more compressed data sets each containing an identifier of the dictionary used to compress the data set,
(b) one or more dictionaries used to compress the data sets in the data stream and to be used by one or more receivers to decompress the compressed data sets, and
(c) one or more dictionary identifiers associated with dictionaries in the data stream to be used by one or more receivers to use the correct dictionary to decompress each of the one or more compressed data sets;
a decompression circuit responsive to the identifiers in the one or more data sets and the dictionary identifiers to decompress the compressed data sets using the correct data compression dictionary; and
a data assembly circuit adapted to receive decompressed data sets from the decompression circuit and to reassemble an uncompressed digital data stream.

* * * * *